United States Patent
Shen et al.

(10) Patent No.: US 9,810,755 B2
(45) Date of Patent: Nov. 7, 2017

(54) SYSTEM AND METHOD FOR ENERGIZING A SUPERCONDUCTING MAGNET

(71) Applicant: General Electric Company, Schenectady, NY (US)

(72) Inventors: Weijun Shen, Florence, SC (US); Timothy John Havens, Florence, SC (US); Longzhi Jiang, Florence, SC (US); Zhenyu Zhang, Florence, SC (US); Venkata Kishore Mogatadakala, Lexington, SC (US)

(73) Assignee: General Electric Company, Schenectady, NY (US)

( * ) Notice: Subject to any disclaimer, the term of this patent is extended or adjusted under 35 U.S.C. 154(b) by 818 days.

(21) Appl. No.: 14/107,216

(22) Filed: Dec. 16, 2013

(65) Prior Publication Data
US 2015/0168517 A1 Jun. 18, 2015

(51) Int. Cl.
G01R 33/3815 (2006.01)
H01F 6/00 (2006.01)
G01R 33/54 (2006.01)
G01R 33/30 (2006.01)
G01R 33/385 (2006.01)

(52) U.S. Cl.
CPC ....... *G01R 33/3815* (2013.01); *G01R 33/307* (2013.01); *G01R 33/385* (2013.01); *G01R 33/546* (2013.01); *H01F 6/005* (2013.01)

(58) Field of Classification Search
CPC .............. G01R 33/3815; G01R 33/385; G01R 33/307; G01R 33/546; H01F 6/005
See application file for complete search history.

(56) References Cited

U.S. PATENT DOCUMENTS

| | | |
|---|---|---|
| 3,150,291 A | 9/1964 | Laquer |
| 3,233,155 A | 2/1966 | Atherton |
| 3,244,943 A | 4/1966 | Hildebrandt et al. |
| 3,262,025 A | 7/1966 | Hildebrandt |
| 3,277,322 A | 10/1966 | Berlincourt |
| 3,320,522 A | 5/1967 | Arnold |
| 3,356,924 A | 12/1967 | Buchhold |

(Continued)

FOREIGN PATENT DOCUMENTS

GB  2457729 A * 8/2009 ......... G01R 33/3802

OTHER PUBLICATIONS

Muta, I. et. al., "The Effect of Excitation Methods on Electrical Characteristics of Fully Superconducting Generator Model," IEEE Transactions on Magnetics, vol. 30, No. 4, Jul. 1994.

(Continued)

*Primary Examiner* — G. M. Hyder

(57) ABSTRACT

A system for energizing a main coil of superconducting magnet in a magnetic resonance imaging (MRI) system includes a cryostat comprising a housing. A first coil is positioned within the housing of the cryostat. Alternatively, the first coil may be positioned external to the housing of the cryostat. A second coil is coupled to the first coil and positioned external to the housing of the cryostat. The second coil is configured to inductively couple to the main coil. A controller is coupled to the first coil and the second coil and is configured to control the first coil and the second coil to induce current in the main coil.

20 Claims, 6 Drawing Sheets

(56) References Cited

U.S. PATENT DOCUMENTS

| | | | |
|---|---|---|---|
| 3,522,512 A | | 8/1970 | Buchhold |
| 3,568,002 A | | 3/1971 | Robins et al. |
| 3,602,854 A | | 8/1971 | Kawabe et al. |
| 3,848,162 A | | 11/1974 | Ichikawa et al. |
| 4,096,403 A | | 6/1978 | Rabinowitz et al. |
| 4,709,314 A | | 11/1987 | Van de Klundert et al. |
| 5,105,098 A | | 4/1992 | Gattozzi |
| 5,633,588 A | * | 5/1997 | Hommei ............ G01R 33/3815 324/319 |
| 5,965,959 A | * | 10/1999 | Gamble .................. H01F 6/005 307/113 |
| 6,157,094 A | | 12/2000 | Gamble et al. |
| 6,621,395 B1 | | 9/2003 | Bromberg |
| 6,809,618 B2 | | 10/2004 | Leghissa et al. |
| 6,909,618 B2 | | 6/2005 | Murakami |
| 6,946,936 B2 | | 9/2005 | Schauwecker et al. |
| 6,958,898 B2 | | 10/2005 | Ries et al. |
| 7,064,550 B2 | | 6/2006 | Shen |
| 7,068,133 B2 | | 6/2006 | Ries |
| 7,606,019 B2 | | 10/2009 | Spreiter et al. |

OTHER PUBLICATIONS

Coombs, T.A. et. al., "The Next Generation of Superconducting Permanent Magnets: The Flux Pumping Method," IEEE Transactions on Applied Superconductivity, vol. 19, No. 3, Jun. 2009.

Chung, Y. et. al., "Theoretical Analysis and Design Consideration of Advanced Linear Type Magnetic Flux Pumo," IEEE Transactions on Applied Superconductivity, 2010.

Yan, Y. et. al., "Thermally Actuated Magnetization Method in High Temperature Superconductor Bulks," IEEE Transactions on Applied Superconductivity, vol. 20, No. 3, Jun. 2010.

Hoshino, T. et. al., "Turn Off Trigger Energy Characteristics of the Superconducting Power Electronics Device (S-PED)—in Case of Type D," IEEE Transactions on Applied Superconductivity, vol. 9, No. 2, Jun. 1999.

The Meissner Effect—An unintuitive property of superconductors, last view at http://www.docstoc.com/docs/119949644/The-Meissner-Effect---PowerPoint---PowerPoint on Mar. 8, 2014, 17 pages.

International Search Report and Written Opinion from corresponding PCT application No. PCT/US2014/048615 dated Nov. 18, 2014; 14 pages.

Atherton, D.L. et al., "1000-A Cryotrons for Superconducting-Magnet Flux Pumps," Rev. Sci. Instrum., vol. 45, No. 12, Dec. 1974.

Lee, H. et.al., "A Flux Pump for NMR Magnets," IEEE Transactions on Spplied Superconductivity, vol. 12, No. 2, Jun. 2003.

Bai, Z. et al., "A Newly Developed Pulse-Type Microampere Magnetic Flux Pump," IEEE Transactions on Applied Supeconductivity, vol. 20, No. 3, Jun. 2010.

Yan, Y. et al., "A Novel Design of Thermally Actuated Magnetization Flux Pump for High Temperature Superconducting Bulks," IEEE Transactions on Applied Superconductivity, 2010.

Bai, Z. et. al., "A Novel High Temperature Superconducting Magnetic Flux Pump for MRI Magnets," Cryogenics 80 (2010) 688-692.

Droege, T.F., et. al., "A Slow Cycling Flux Pump Using Digital Control," IEEE Transactions on Magnetics, vol. MAG-11, No. 2, Mar. 1975.

Ahn, M. et. al., "A Study on the Efficiency of Low-Tc Superconducting Power Supply Considering the Series-parallel Connections of Superconducting Circuits," IEEE Transactions on Applied Superconductivity, vol. 12, No. 1, Mar. 2002.

Coombs, T. et. al., "A Thermally Actuated Superconducting Flux Pump," Physica C 468 (2008) 153-159.

Homer, G.J. et. al. "A Thermally Switched Flux Pump," IEEE Transactions on Magnetics, vol. MAG-11, No. 2, Mar. 1975.

Davey, K.R., et al., "Activation of Trapped Field Magnets by Flux Pumping," IEEE Transactions on Magnetics, vol. 47, No. 5, May 2011.

Yoon, Y., et. al., "Analysis of the Operational Characteristics of a Heater-Trigger Type High-Tc Superconducting Power Supply," IEEE Transactions on Applied Superconductivity, vol. 9, No. 4, Dec. 1999.

Yoon, Y. et. al., "Analysis of the Operational Characteristics of a High-Tc Superconducting Power Supply with the Bi-2223 Pancake Load," IEEE Transactions on Applied Superconductivity, vol. 11, No. 3, Sep. 2001.

Kim, H. et. al., "Analysis of the Operational Characteristics of Discrete-Sheet Type Low-Tc Superconducting Power Supply," IEEE Transactions on Applied Superconductivity, vol. 11, No. 1, Mar. 2001.

Mawardi, O.K., et. al., "Armature Reaction in a Flux Pump," IEEE Transactions on Magnetics, vol. MAG-23, No. 2, Mar. 1987.

Kikuchi, S. et. al., "Behavior of a New DC Electromagnetic Pump USing Superconducting Magnet," IEEE Transactions on Magnetics, vol. MAG-13, No. 5, Sep. 1977.

Bae, D. et. al., "Characteristic Analysis of a Heater-Triggered Switching System for the Charging of B1-2223 Double-Pancake Load," IEEE Transactions on Applied Superconductivity, vol. 13, No. 2, Jun. 2003.

Chung, Y. et al., "Characteristics of a Persistent Current Compensator for Supersonducting NMR Magnets USing Linear Type Magnetic Flux Pump," IEEE Transactions on Applied Superconductivity, vol. 15, No. 2, Jun. 2005.

Murata, Y. et. al. "Coupled Thermal-Magnetic Analysis on Thermally Actuated Superconducting Flux Pump," IEEE Transactions on Applied Superconductivity, 2010.

Mawardi, O.K. et. al., "Current Distribution in a Moving Spot Flux Pumo," IEEE Transactions on Magnetics, vol. MAG-23, No. 2, Mar. 1987.

Chung, Y. et. al., "Current Pumping Performance of Linear-Type Magnetic Flux Pump with Use of Feedback Control Circuit System," IEEE Transactions on Applied Superconsuctivity, vol. 16, No. 2, Jun. 2006.

Chung, Y. D. et. al., "Design and Performance of Compensator for Decremental Persistent Current in HTS Magnets Using Linear Type Magnetic Flux Pump," Cryogenics 44 (2004) 839-844.

Yoon, Y. et. al., "Design and Test of a Superconducting Power Supply with YBCO Coated Conductor Load," IEEE Transactions on Applied Superconductivity, vol. 18, No. 2, Jun. 2008.

Chen, A. et. al., "Design of the Cryogenic System for a 400 kW Experimental HTS Synchronous Motor," IEEE Transactions on Applied Superconductivity, /vol. 20, No. 3, 2010.

Yoon, Y. et. al., "Determination of Equivalent Circuit Parameters of the Low-Tc Superconducting Power Supply for Charging of Superconducting Magnet," IEEE Transactions on Applied Superconductivity, vol. 13, No. 2, Jun. 2003.

Otsuka, A. et. al., "Drift Compensation of 600 MHz NMR Magnet," IEEE Transactions on Applied Superconductivity, vol. 17, No. 2, Jun. 2007.

Del Vecchio, P. et. al., "Eddy Current Computation in a Superconducting Electromagnetic Pump," IEEE Transactions on Magnetics, vol. MAG-19, No. 9, Nov. 1983.

Jo, H. et. al., "Experimental Analysis of Flux Pump for Compensating Current Decay in the Persistent Current Mode Using HTS Magnet," IEEE Transactions on Applied Superconductivity, vol. 26, No. 3, Jun. 2010.

Lakrimi, M. et. al., "Flux Injector for NMR Magnets," IEEE Transactions on Applied Superconductivity, vol. 17, No. 2, Jun. 2007.

Hoffman, C. et. al., "Flux Pump for HTS Magnet," IEEE Transactions on Applied Superconductivity, 2010.

Nakamura, T. et. al., "Flux Pumping Effect of HTS Films in a Traveling Magnetic Field," IEEE Transactions on Applied Superconductivity, vol. 20, No. 3, Jun. 2010.

R.B. Britton, "Flux Pumps for USe at 60 Hz," IEEE 1971.

S. Wipf, "Flux Pumps with Moving Magnetic Fields," IEEE Transactions on Magnetics, Sep. 1968.

Oomen, M. et. al., "HTS Flux Pump for Cryogen-Free HTS Magnets," IEEE Transactions on Applied Superconductivity, vol. 15, No. 2, Jun. 2005.

(56) References Cited

OTHER PUBLICATIONS

Ivanov, S.S., et. al., "Investigations of Current-Carrying Capacity and Quench Behaviour of a Composite Superconductor by Magnetic Flux Pumping Method," IEEE Transactions on Magnetics, vol. 30, No. 4, Jul. 1994.

Iwasa, Y., "Microampere Flux Pumps for Superconducting NMR Magnets Part 1: Basic Concept and Microtesla Flux Measurement," Cryogenics 41 (2001) 385-391.

Newhouse, V., "On Minimizing Flux Pump Heat Dissipation," IEEE Transactions on Magnetics, vol. MAG-4, No. 3, Sep. 1968.

Mawardi, O.K. et. al., "Operational Characteristics of a Flux Pump," IEEE Transactions on Magnetics, vol. MAG-15, No. 1, Jan. 1979.

Tsukiji, H. et. al., "Output Power Limit of 200 MW Class Brushless Superconducting Generator Excited with MAgnetic Flux Pump," IEEE Transactions on Applied Superconductivity, vol. 11, No. 1, Mar. 2001.

Ko, T. et. al., "Parametric Representation of a Superconducting High-Current Generator," IEEE Transactions on Magnetics, vol. 25, No. 5, Sep. 1989.

Chung, Y. et. al., "Performances of a Linear Type Magnetic Flux Pump for Compensating a Little Decremented Persistent Current of HTS Magnets," IEEE Transactions on Applied Superconductivity, vol. 14, No. 2, Jun. 2004.

Chung, Y. et. al., "Proposal and Fundamental Analysis of Cylindrical Type Magnetic Flux Pump for High Field MAgnet," IEEE Transactions on Applied Superconductivity, vol. 20, No. 3, Jun. 2010.

Kohjiro, S. et. al., "Radiation Power of NbN-Based Flux-Flow Oscillators for THz-Band Integrated SIS Receivers," IEEE Transactions on Applied Superconductivity, vol. 13, No. 2, Jun. 2003.

Ishmael, S. et. al., "Simulation of Magnetically Triggered MgB2 Switches," IEEE Transactions on Applied Superconductivity, 2010.

Wang, Q. et. al., "Study of Full-wave Superconducting Rectifier-type Flux Pumos," IEEE Transactions on Magnetics, vol. 32, No. 4, Jul. 1996.

Del Vecchio, P. et. al., "Superconducting Magnets for Electromagnetic D.C. Pumps," IEEE Transactions on Magnetics, vol. MAG-21, No. 2, Mar. 1985.

Jeong, S. et. a;., "Superconducting Micro Flux Pump Using a Cryotron-Like Switch," IEEE Transactions on Applied Superconductivity, vol. 13, No. 2, Jun. 2003.

Tsukiji, H. et. al., "Tests of Disk Type Magnetic Flux Pump with the Ability of High Voltage Output," IEEE Transactions on Applied Superconductivity, vol. 7, No. 2, Jun. 1997.

Oh, Y. et. al., "The Analysis of the Temperature Distribution with Respect to Heat Generation on Nb Sheet in the Superconducting Fluxpump," IEEE Transactions on Applied Superconductivity, vol. 7, No. 2, Jun. 1997.

Bae, J. et. al., "The Design, Manufacture and Characteristic Experiment of a Superconducting Fluxpump with Superconducting Excitation Coil," IEEE Transactions on Applied Superconductivity, vol. 7, No. 2, Jun. 1997.

Joo, M. et. al., "The Determination of Equivalent Circuit Parameters Due to Continuous Switching Action in the Superconducting Flux Pump," IEEE Transactions on Applied Superconductivity, vol. 7, No. 2, Jun. 1997.

\* cited by examiner

SYSTEM AND METHOD FOR ENERGIZING A SUPERCONDUCTING MAGNET

FIELD OF THE INVENTION

The present invention relates generally to a magnetic resonance imaging (MRI) system and in particular to a system and method for energizing a superconducting magnet in a MRI system.

BACKGROUND OF THE INVENTION

Magnetic resonance imaging (MRI) is a medical imaging modality that can create images of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

MRI systems may utilize a superconducting magnet to generate a main magnetic field, B0. A superconducting magnet includes superconducting coils that are enclosed in a cryogenic environment within a cryostat (or magnet vessel) designed to maintain the temperature of the superconducting coils below an appropriate critical temperature so that the coils are in a superconducting state with zero resistance. For example, the windings of the superconducting magnet may be immersed in a bath or vessel of liquid helium to maintain the temperature below the critical temperature for superconducting operation. During installation and start-up of an MRI system, the superconducting magnet is energized (or ramped) by introducing electrical current to generate the appropriate main magnetic field strength. Typically, a large power supply (e.g., 1000 Amps) may be used to provide current to the superconducting magnet coils.

The superconducting magnet may also require additional energy during the operating life of the MRI system after installation. MRI systems require a uniform main magnetic field in the imaging volume, however, the main magnetic field may drift or decay over time after installation due to various factors such as imperfections in the magnet. Change or drift in the main magnetic field can adversely affect the performance of the MRI system including data acquisition and reconstruction of an MR image. Accordingly, energy may need to be provided to the superconducting magnet during maintenance to return (e.g., increase) the main magnetic field to the appropriate strength. As mentioned, a large power supply is typically used to provide energy to the superconducting magnet.

Conventional methods of energizing superconducting magnets, however, have several disadvantages. The large power supplies can be heavy and expensive. In addition, the power supply may utilize large, high rated current leads that are connected to the cryostat and designed to handle the high electrical current required by the main coils of the superconducting magnet. The connections to the main coils in the cryostat can lead to loss of liquid helium which is expensive to replace.

It would be desirable to provide a system and method for energizing a superconducting magnet that reduces or eliminates liquid helium loss and reduces the cost of installation, operating and servicing an MRI system.

BRIEF DESCRIPTION OF THE INVENTION

In accordance with an embodiment, a system for energizing a main coil of superconducting magnet in a magnetic resonance imaging (MRI) system includes a cryostat comprising a housing, a first coil positioned within the housing of the cryostat, a second coil coupled to the first coil and positioned external to the housing of the cryostat, the second coil configured to inductively couple to the main coil and a controller coupled to the first coil and the second coil and configured to control the first coil and the second coil to induce current in the main coil.

In accordance with another embodiment, a system for energizing a main coil of a superconducting magnet of a magnetic resonance imaging (MRI) system, the superconducting magnet located in a cryostat having a housing includes a first coil positioned external to the housing of the cryostat, a second coil coupled to the first coil and positioned external to the housing of the cryostat, the second coil configured to inductively couple to the main coil and a controller coupled to the first coil and the second coil and configured to control the first coil and the second coil to induce current in the main coil.

BRIEF DESCRIPTION OF THE DRAWINGS

The invention will become more fully understood from the following detailed description, taken in conjunction with the accompanying drawings, wherein the reference numerals refer to like parts in which.

DETAILED DESCRIPTION

Figure 1:
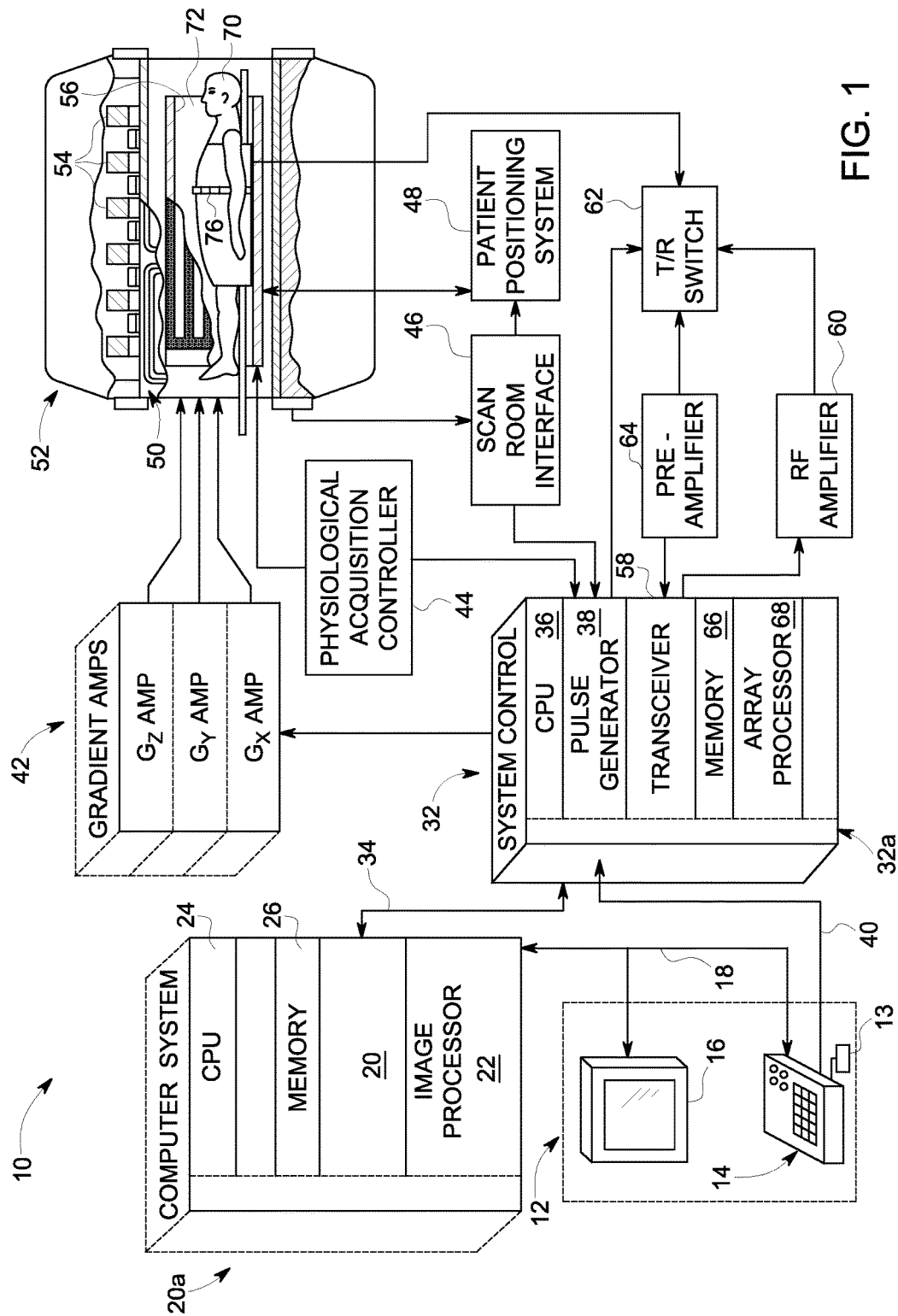
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connection 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communication link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operated the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$ and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 or parallel or surface coil 76 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands receive from the operator console 12 this image data may be archived in long term storage or it may be further processed by the image processor 22 and conveyed to the operator console 12 and presented on display 16.

Figure 2:
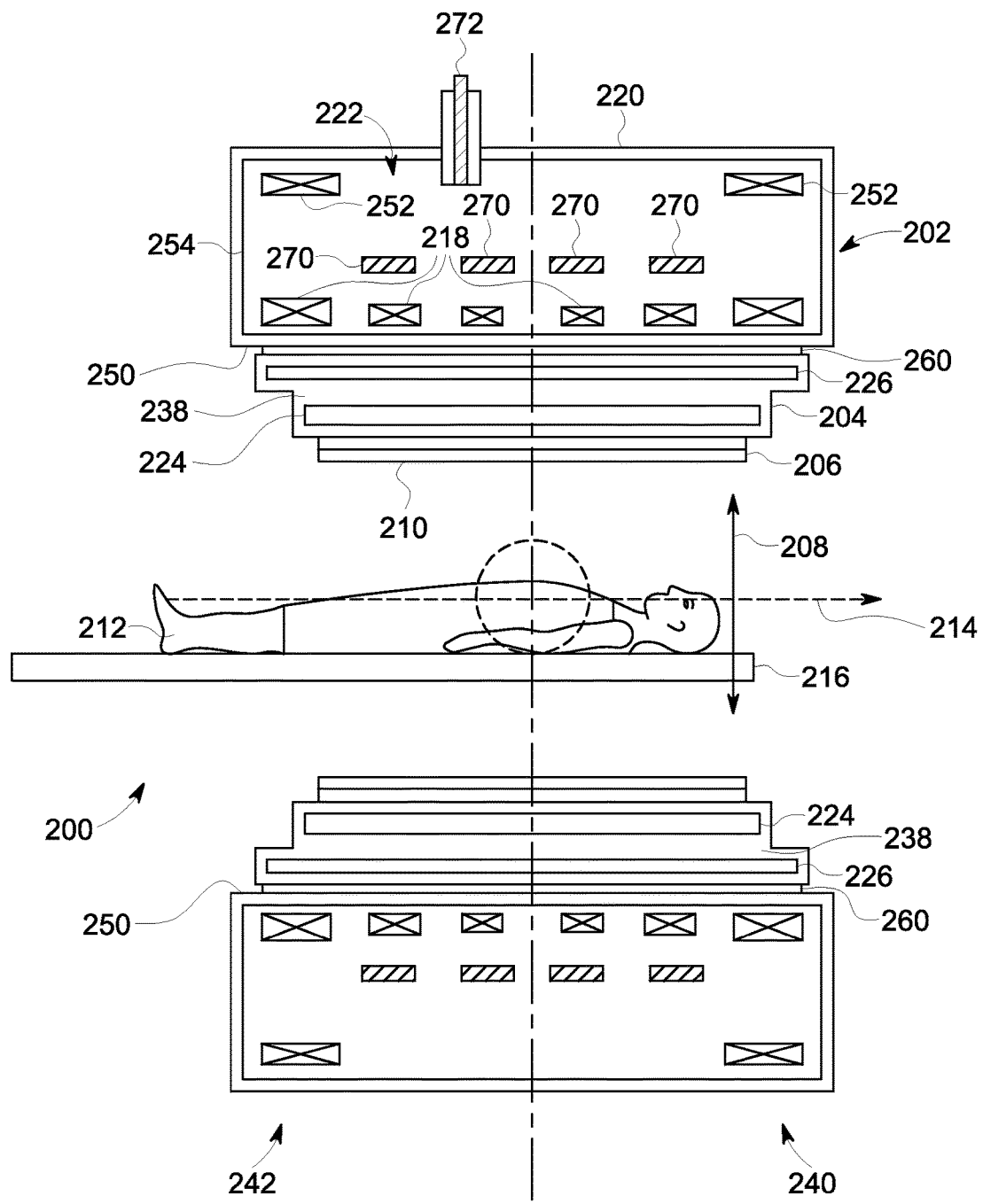
FIG. 2 is a schematic side elevation view of a resonance assembly in accordance with an embodiment.

FIG. 2 is a schematic side elevation view of a resonance assembly in accordance with an embodiment. Resonance assembly 200 may be used in an MRI system such as MRI system 10 shown in FIG. 1. The resonance assembly 200 is cylindrical in shape and includes, among other elements, a superconducting magnet 202, a gradient coil assembly 204 and a RF coil 206. Various other elements such as covers, supports, suspension members, end caps, brackets, etc. are omitted from FIG. 2 for clarity. A cylindrical patient volume or bore 208 is surrounded by a patient bore tube 210. RF coil 206 is cylindrical and is disposed around an outer surface of the patient bore tube 210 and mounted inside the cylindrical gradient coil assembly 204. The gradient coil assembly 204 is disposed around the RF coil 206 in a spaced apart coaxial relationship and the gradient coil assembly 204 circumferentially surrounds the RF coil 206. Gradient coil assembly 204 is mounted inside a warm bore 250 of the magnet 202 and is circumferentially surrounded by magnet 202.

A patient or imaging subject 212 may be inserted into the resonance assembly 200 along a center axis (e.g., a z-axis) 214 on a patient table or cradle 216. The patient table or cradle 216 is inserted into the resonance assembly at a "patient end" 242 of the resonance assembly and the opposing end is a "service end" 240. Center axis 214 is aligned along the tube axis of the resonance assembly 200 parallel to the direction of the main magnetic field, Bo, generated by the magnet 202. RF coil 206 may be used to apply a radio frequency pulse (or a plurality of pulses) to a patient or subject 212 and may be used to receive MR information back from the subject 212 as is well known in the field of MR imaging. Gradient coil assembly 204 generates time dependent gradient magnetic pulses that are used to spatially encode points in the imaging volume in a known manner.

Superconducting magnet 202 may include, for example, several radially aligned and longitudinally spaced apart superconductive main coils 218, each capable of carrying a large current. The superconductive main coils 218 are designed to create a magnetic field, B0, within the patient volume 208. An outer set of bucking coils 252 are used to provide, for example, control of stray magnetic fields. A set of superconducting shielding coils 270 (e.g., moving metal coils) are used to, for example, prevent interference of external electromagnetic disturbances. The superconductive main coils 218, bucking coils 252 and shielding coils 270 are enclosed in a cryogenic environment within a cryostat 222. The cryogenic environment is designed to maintain the temperature of the superconducting coils 218, 252, 270 below the appropriate critical temperature so that the superconducting coils 218, 252, 270 are in a superconducting state with zero resistance. Cryostat 222 may include, for example, a helium vessel 254 and thermal shields (not shown) for containing and cooling magnet windings in a known manner. Superconducting magnet 202 is enclosed by a vacuum vessel 220, e.g., a cryostat vessel. Vacuum vessel 220 is configured to maintain a vacuum and to prevent heat from being transferred to the cryogenic environment. A warm bore 250 is defined by an inner cylindrical surface of the vacuum vessel 220. Leads 272 are used to provide current input to the various superconducting coils 218, 252, 270.

Gradient coil assembly 204 may be, for example, a self-shielded gradient coil assembly. Gradient coil assembly 204 comprises a cylindrical inner gradient coil assembly or winding 224 and a cylindrical outer gradient coil assembly or winding 226 disposed in a concentric arrangement with respect to a common axis 214. Inner gradient coil assembly 224 includes inner (or main) X-, Y- and Z-gradient coils and outer gradient coil assembly 226 includes the respective outer (or shielding) X-, Y- and Z-gradient coils. The coils of the gradient coil assembly 204 may be activated by passing an electric current through the coils to generate a gradient field in the patient volume 208 as required in MR imaging. A volume 238 or space between inner gradient coil assembly 224 and outer gradient coil assembly 226 may be filled with a bonding material, e.g., epoxy resin, visco-elastic resin, polyurethane etc. Alternatively, an epoxy resin with filler material such as glass beads, silica and alumina may be used as the bonding material. It should be understood that magnet and gradient topologies other than the cylindrical assemblies described above with respect to FIGS. 1 and 2 may be used. For example, an open architecture MRI system may also utilize embodiments of the invention as described below.

Figure 3:
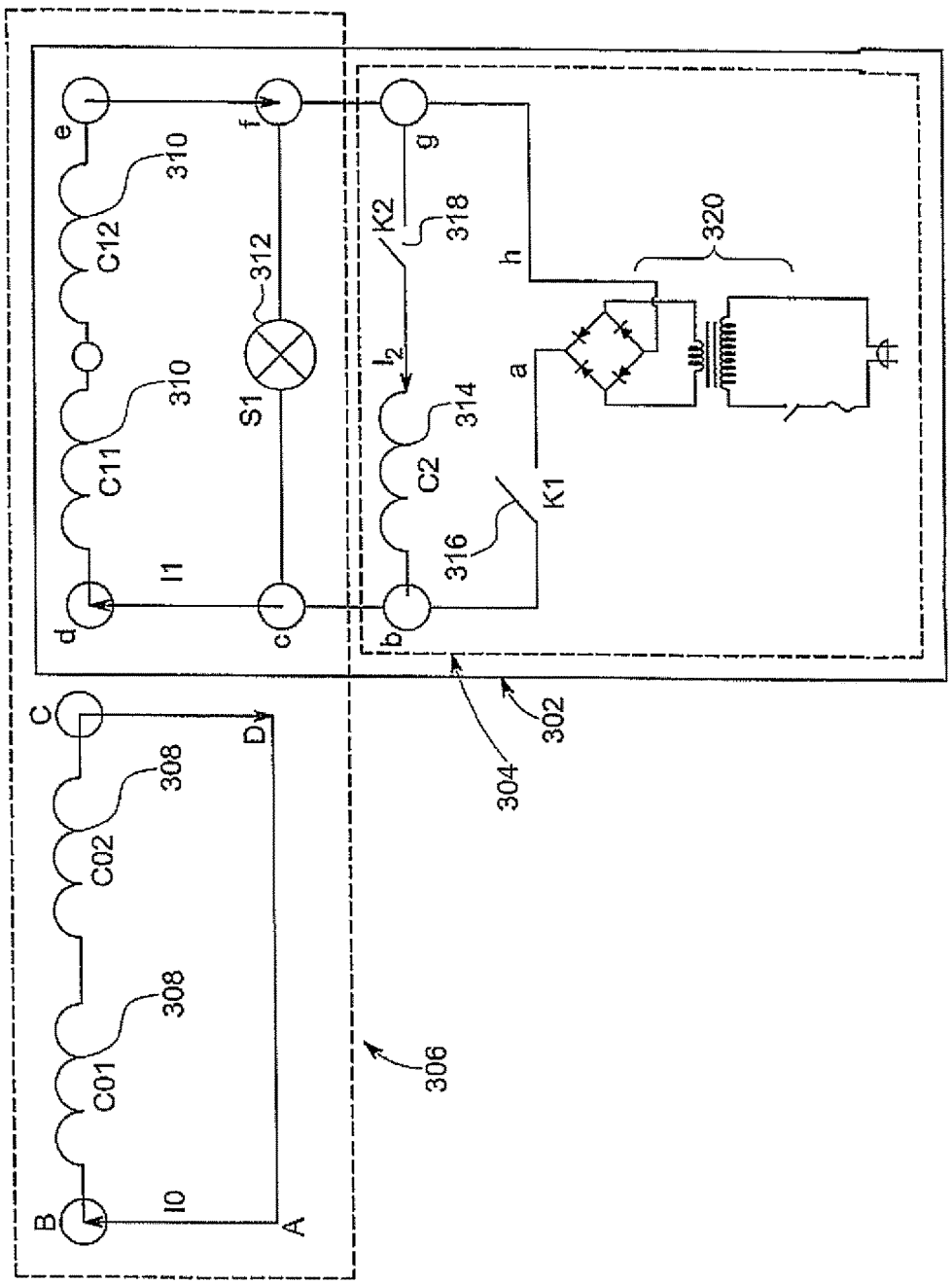
FIG. 3 is a schematic circuit diagram of a system for energizing a superconducting magnet in accordance with an embodiment.

The superconducting magnet 202 is energized (ramped) during installation and startup and may also require additional energy during the operating life of the MRI system after installation. FIG. 3 is a schematic circuit diagram of a system for energizing a superconducting magnet in accordance with an embodiment. The system 302 is configured to induce current in the main coils 308 of a superconducting magnet and to introduce electrical energy from a room temperature environment to a superconducting magnet in a cryogenic environment. The main coils 308 are contained within a cryogenic environment (designated by dotted lines 306) such as helium vessel 254 shown in FIG. 2. As the current in the main coils 308 is increased, the magnetic field generated by the main coils 308 is increased. Accordingly, system 302 may be used to provide energy to the main coils 308 as described further below. System 302 includes a first coil 310 that is positioned within the cryogenic environment 306. The first coil 310 may include one or more windings or coils such as windings C11 and C12. The first coil 310 is configured so that it does not inductively couple with the main coils 308. In one embodiment, the first coil 310 is a shielding coil such as shielding coil 270 shown in FIG. 2.

A second coil (C2) 314 is coupled to the first coil 310. The second coil 314 is positioned in a room temperature environment (designated by dotted lines 304) external to the superconducting magnet cryostat. The second coil 314 is configured so that it is inductively coupled with the main coils 308. The second coil 314 is a resistive coil and may be, for example, multiple turns of insulated copper wire. In one embodiment, the second coil 314 is a separate coil positioned within the resonance assembly of the MRI system, for example, resonance assembly 200 shown in FIG. 2. The second coil 314 can be positioned at various radial locations in the resonance assembly as shown in FIG. 2. For example, the second coil 314 may be inserted in a space between the warm bore 250 and the gradient coil assembly 204. Preferably, the second coil 314 is positioned around the magnetic axial direction. Returning to FIG. 3, in this embodiment second coil 314 may be coupled to the first coil 310 using physical connections, for example, between points b and c and between points f and g. The physical connections may be made using, for example, the current leads 272 (shown in FIG. 2) to the cryostat. The physical connections may be, for example, an electrical plug and receptacle set. Before ramping the magnet, the first coil 310 and second coil 314 are connected. The first coil 310 and second coil 314 may be disconnected after ramping. In one embodiment, the second coil 314 may be removed from the resonance assembly after ramping. Access to the resonance assembly may be provided at the service end 240 (shown in FIG. 2) of the resonance assembly.

Figure 5:
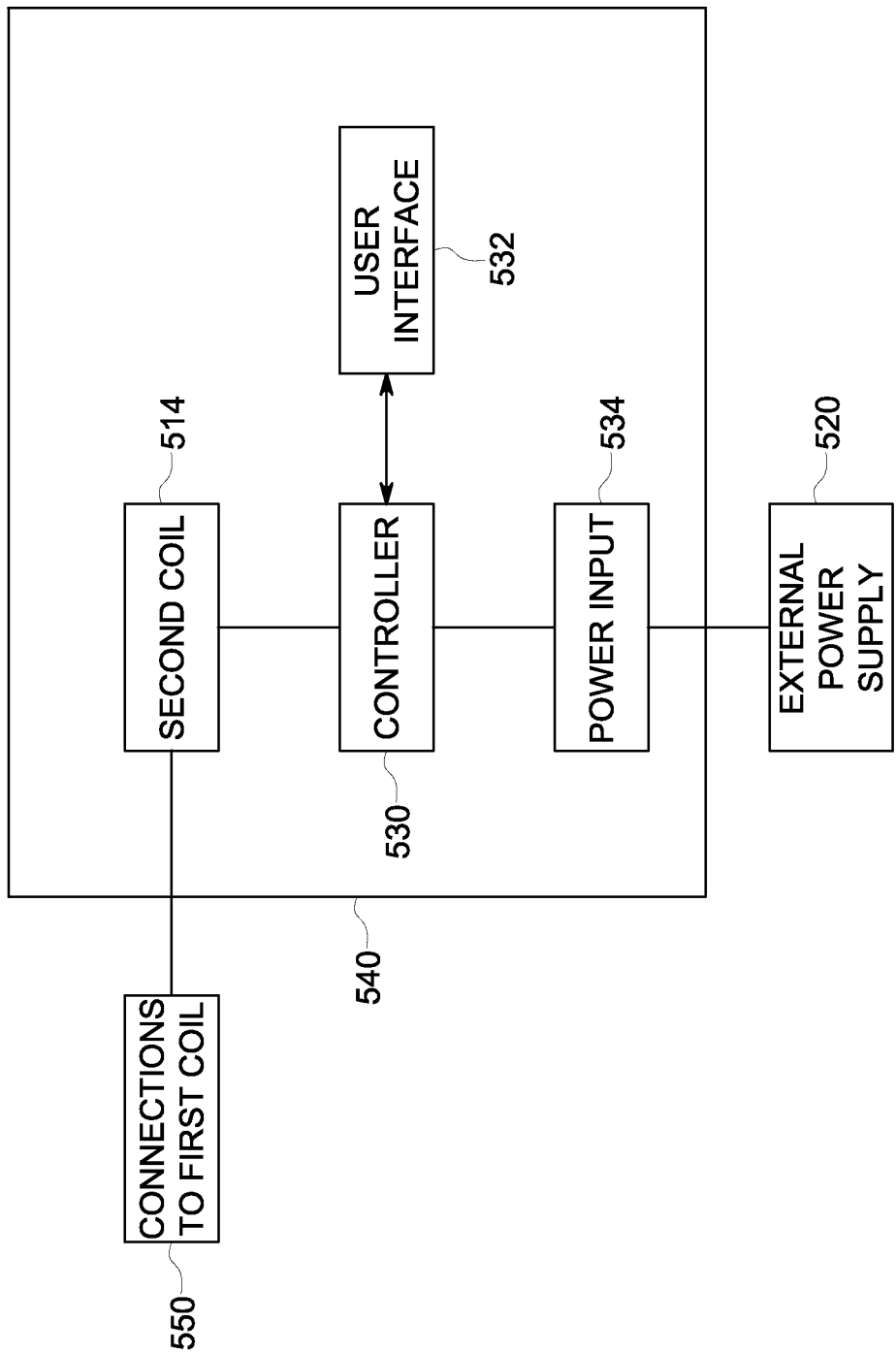
FIG. 5 is a schematic block diagram of a portable apparatus for use in a system for energizing a superconducting magnet in accordance with an embodiment.

In another embodiment, the second coil 314 may be a separate coil that is external to the MRI system, for example, in a portable housing. FIG. 5 is schematic block diagram of a portable apparatus for use in a system for energizing a superconducting magnet in accordance with an embodiment. In FIG. 5, the second coil 514 is a resistive coil and may be, for example, multiple turns of insulated copper wire. The second coil 514 may be enclosed in a portable housing 540. A controller 520 and user interface 532 are coupled to the second coil 514 and may be used to control the current in the second coil 514, as well as in the first coil (not shown), to allow the second coil 514 to magnetically couple to the main coils of a superconducting magnet. A power input 534 connects to and receives power from an external power supply 520 such as, for example, a low current AC power supply with AC frequency. The second coil 514 is positioned near or within the MRI system resonance assembly (e.g., in the patient imaging space in the patient bore tube). In addition, the second coil 514 may be connected to the first coil (shown in FIG. 3) via connections 550. Connections 550 may be physical connections. Returning to FIG. 3, the physical connections may be between points b and c and between points f and g. The physical connections may be made using, for example, the current leads 272 (shown in FIG. 2) to the cryostat. The physical connections may be, for example, an electrical plug and receptacle set. Before ramping the magnet, the first coil 310 and second coil 314 are connected. The first coil 310 and second coil 314 may be disconnected after ramping. Access to the resonance assembly may be provided at the service end 240 (shown in FIG. 2) of the resonance assembly.

In FIG. 3, a power supply 320 is also coupled to the first coil 310 and the second coil 314 via a switch (K1) 316 a switch (K2) 318 and a superconducting switch (S1) 312. As mentioned, the power supply may be, for example, a low current AC power supply with AC frequency. A controller (not shown) is used to control the operation of system 302 and may be, for example, a controller of the MRI system control computer 32 (shown in FIG. 1) or may be a separate external controller coupled to the second coil 314 and the power supply 320. The system 320 is controlled so the second coil 314 magnetically couples to the main coils 308 to induce current in the main coils 308 and thereby increase the current in the main coils 308 resulting in an increase in main magnetic field. In particular, switches 312, 316 and 318 and power supply 320 are controlled to increase the current in the main coils 308 to reach a target current (and target magnetic field strength). Table 1 below shows an exemplary operating cycle to utilize the system 302 to energize the main coils 308.

TABLE 1

| STEP | S1 | K1 | K2 | I0 | I1 | I2 |
|------|------|-------|-------|-----|----|----|
| 1 | Open | Close | Open | 0 | I1 | 0 |
| 2 | Close | Close | Open | 0 | I1 | 0 |
| 3 | Close | Open | Close | 0 | I2 | I2 |
| 4 | Open | Open | Close | ΔI0 | 0 | 0 |
| 5 | Open | Close | Open | ΔI0 | 0 | 0 |

At a first step, switches 312 and 318 are open and switch 316 is closed and the power supply provides an input current I1 which flows through loop a-b-c-d-e-f-g-h-a. At the second step, the power supply current is withdrawn and switch 312 is closed resulting in current I1 flowing through loop c-d-e-f. At the third step, switch 316 is opened and switch 318 is closed. Current I1 still flows through loop c-d-e-f. At the fourth step, switch 312 is opened which allows current I1 to decay to zero through loop b-c-d-e-f-g-b. Second coil 314 induces current ΔI0 in the main coils 308 through loop A-B-C-D during the cycle. At the fifth step, switch 316 is closed. If the current in the main coils 308 has not reached the target current, these the steps are repeated. When the current in the main coils 308 reaches the target current, the process is stopped. If appropriate, the second coil 314 can then be disconnected from the first coil 310 and, in some embodiments, removed from the MRI system.

Figure 4:
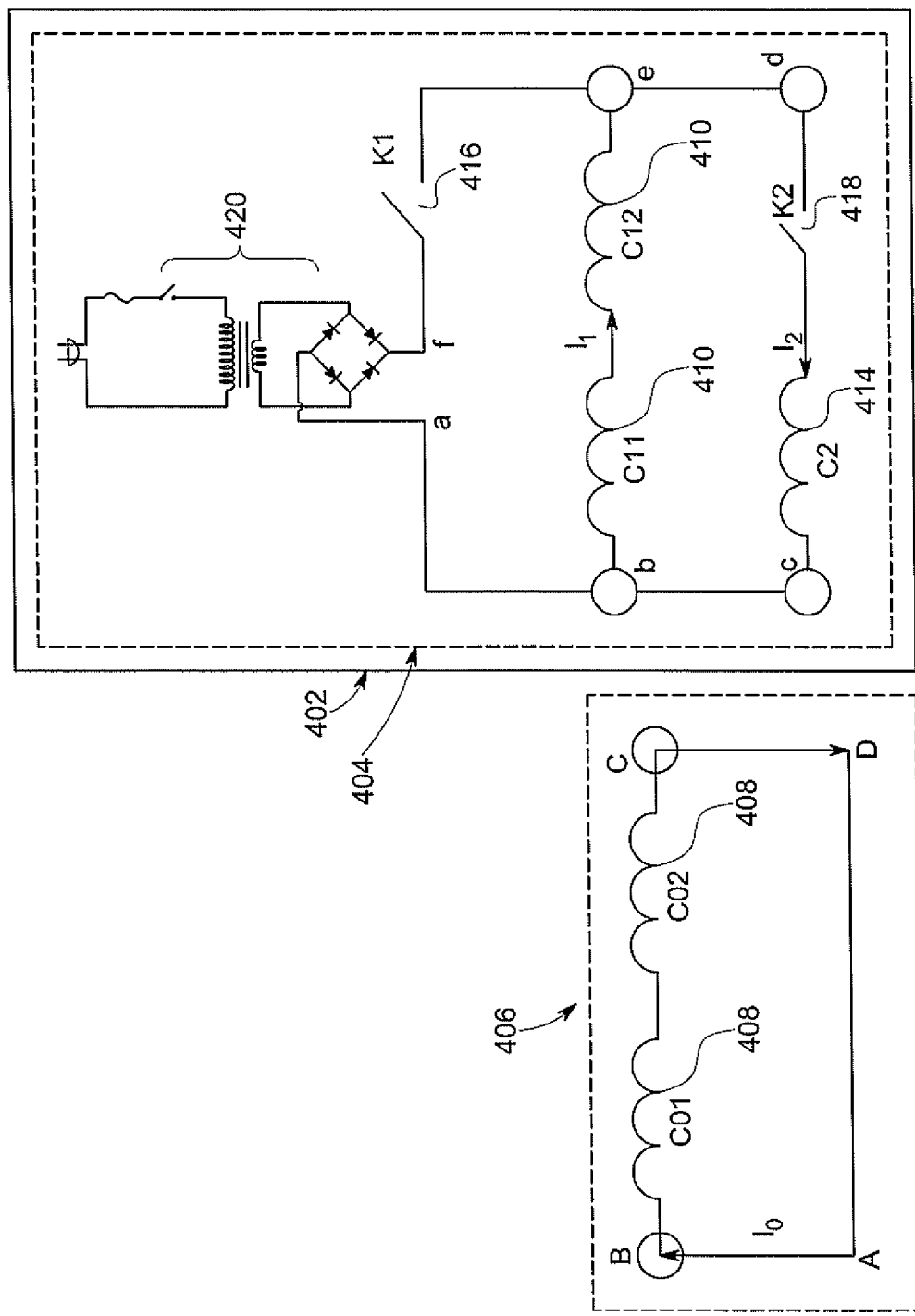
FIG. 4 is a schematic circuit diagram of a system for energizing a superconducting magnet in accordance with an embodiment.

It would also be advantageous to remove any physical connection between the cryogenic and room temperature environments to eliminate potential loss of liquid helium. FIG. 4 is a schematic circuit diagram of a system for energizing a superconducting magnet in accordance with an embodiment. The system 402 is configured to induce current in the main coils 308 of a superconducting magnet and to introduce electrical energy from a room temperature environment to a superconducting magnet in a cryogenic environment. The main coils 408 are contained within a cryogenic environment (designated by dotted lines 406) such as helium vessel 254 shown in FIG. 2. As the current in the main coils 408 is increased, the magnetic field generated by the main coils 408 is increased. Accordingly, system 402 may be used to provide energy to the main coils 408 as described further below. System 402 includes a first coil 410 that is positioned within a room temperature environment (designated by dotted lines 404) external to the superconducting magnet cryostat. The first coil 410 is a resistive coil and may include one or more windings or coils such as windings C11 and C12. The first coil 410 is configured so that it does not inductively couple with the main coils 408.

In one embodiment, the first coil 410 is a separate coil positioned within the resonance assembly of the MRI system, for example, resonance assembly 200 shown in FIG. 2. The first coil 410 can be positioned at various radial locations in the resonance assembly as shown in FIG. 2. For example, the first coil 410 may be inserted in a space between the warm bore 250 and the gradient coil assembly 204. Returning to FIG. 3, in another embodiment, the first coil 310 is a portion of a gradient coil, for example, in gradient coil assembly 204 shown in FIG. 2. For example, one half of an axial z-gradient coil may be used as first coil 310. In yet another embodiment, the first coil 410 may be a separate coil that is external to the MRI system, for example, in a portable housing as discussed further below with respect to FIG. 6.

A second coil (C2) 414 is coupled to the first coil 410. The second coil 414 is also positioned in the room temperature environment external to the superconducting magnet cryostat. The second coil 414 is configured so that it is inductively coupled with the main coils 408. The second coil 414 is a resistive coil and may be, for example, multiple turns of insulated copper wire. In one embodiment, the second coil 414 is a separate coil positioned within the resonance assembly of the MRI system, for example, resonance assembly 200 shown in FIG. 2. The second coil 414 may be positioned at various radial locations in the resonance assembly as shown in FIG. 2. For example, the second coil 414 may be inserted in a space between the warm bore 250 and the gradient coil assembly 204. Preferably, the second coil 414 is positioned around the magnetic axial direction. Returning to FIG. 4, the second coil 414 may be coupled to the first coil 410 using physical connections, for example, between points b and c and between points d and e. The physical connections may be, for example, an electrical plug and receptacle set. Before ramping the magnet, the first coil 410 and second coil 414 are connected. The first coil 410 and second coil 414 may be disconnected after ramping. In one embodiment, the second coil 414 may be removed from the resonance assembly after ramping. Access to the resonance assembly may be provided at the service end 240 (shown in FIG. 2) of the resonance assembly.

Figure 6:
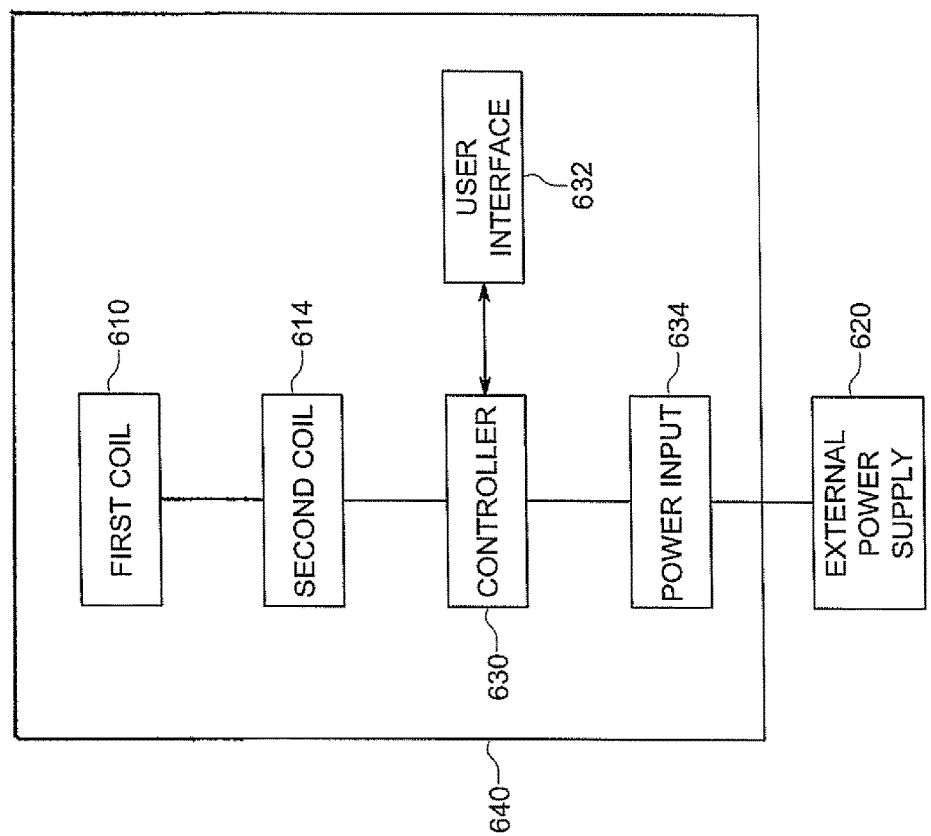
FIG. 6 is a schematic block diagram of a portable apparatus for use in a system for energizing a superconducting magnet in accordance with an embodiment.

In another embodiment, the second coil 414 may be a separate coil that is external to the MRI system, for example, in a portable housing as described above with respect to FIG. 5. As mentioned above, the first coil 410 may also be external to the MRI system. FIG. 6 is schematic block diagram of a portable apparatus for use in a system for energizing a superconducting magnet in accordance with an embodiment. In FIG. 6, the first coil 610 and the second coil 614 are resistive coils and may be, for example, multiple turns of insulated copper wire. Both the first coil 610 and the second coil 614 may be enclosed in a portable housing 640. A controller 630 and user interface 632 are coupled to the second coil 614 and may be used to control the current in the first coil 610 and the second coil 614 to allow the second coil 614 to magnetically couple to the main coils of a superconducting magnet. A power input 634 connects to and receives power from an external power supply 620 such as, for example, a low current AC power supply with AC frequency. The system 602 is positioned near or within the MRI system resonance assembly (e.g., in the patient imaging space in the patient bore tube). As mentioned above, the second coil 614 may be connected to the first coil 610. The connections may be physical connections. Returning to FIG. 4, the physical connections may be between points b and c and between points d and e. The physical connections may be, for example, an electrical plug and receptacle set.

In the exemplary embodiment of FIG. 4, a power supply 420 is also coupled to the first coil 410 and the second coil 414 via a switch (K1) 416 and a switch (K2) 418. As mentioned above, the power supply 420 may be, for example, a low current AC power supply with AC frequency. A controller (not shown) is used to control the operation of system 402 and may be, for example, a controller of the MRI system control computer 32 (shown in FIG. 1) or may be a separate external controller coupled to the second coil 414 and the power supply 420. The system 402 is controlled so the second coil 414 magnetically couples to the main coils 408 to induce current in the main coils 408 and thereby increase the current in the main coils 408 resulting in an increase in main magnetic field. In particular, switches 416 and 418 and power supply 420 are controlled to increase the current in the main coils 408 to reach a target current (and target magnetic field strength). Table 2 below shows an exemplary operating cycle to utilize the system 402 to energize the main coils 408.

TABLE 2

| STEP | K1 | K2 | I0 | I1 | I2 |
|---|---|---|---|---|---|
| 1 | Close | Open | 0 | I1 | 0 |
| 2 | Open | Close | 0 | I2 | I2 |
| 3 | Open | Close | ΔI0 | 0 | 0 |
| 4 | Close | Open | ΔI0 | 0 | 0 |

At a first step, switch 416 is closed and switch 418 is open and the power supply provides input current I1 which flows through loop a-b-e-f-a. At the second step, switch 416 is opened at the same time switch 418 is closed resulting in a current I2 flowing through loop b-e-d-c-b. At the third step, current I2 will begin to decay to zero and induce current ΔI0 in the main coils 408 through loop A-B-C-D during the cycle. At the fourth step, as current I2 approaches zero, switch 416 is closed and switch 418 is opened. If the current in the main coils 408 has not reached the target current, these the steps are repeated. When the current in the main coils 408 reaches the target current, the process is stopped. If appropriate, the second coil 414 can then be disconnected from the first coil 410 and, in some embodiments, removed from the MRI system.

Computer-executable instructions for energizing a superconducting magnet according to the above-described method may be stored on a form of computer readable media. Computer readable media includes volatile and non-volatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital versatile disks (DVD) or other optical storage, magnetic cassettes, magnetic tape, magnetic disk storage or other magnetic storage devices, or any other medium which can be used to store the desired instructions and which may be accessed by system 10 (shown in FIG. 1), including by internet or other computer network form of access.

A technical effect of the disclosed method and system is that is provides for a computer implemented technique for energizing a superconducting magnet in an MRI system.

This written description used examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A system for energizing a main coil of a superconducting magnet in a magnetic resonance imaging (MRI) system, the system comprising:
    a cryostat comprising a housing surrounding the main coil of the superconducting magnet;
    a first coil positioned within the housing of the cryostat;
    a second coil coupled to the first coil through a first switch and positioned external to the housing of the cryostat, the second coil configured to inductively couple to the main coil;
    a power supply positioned external to the housing of the cryostat and coupled to the second coil and the first coil through a second switch; and
    a controller coupled to the power supply, the second coil and the first coil, and configured to control the second coil and the first coil to induce current in the main coil.

2. The system according to claim 1, wherein the first coil is a superconducting coil.

3. The system according to claim 1, wherein the first coil is a shielding coil.

4. The system according to claim 1, wherein the second coil is a resistive coil.

5. The system according to claim 4, wherein the second coil comprises multiple turns of copper wire.

6. The system according to claim 1, wherein the second coil is positioned within a resonance assembly of the MRI system.

7. The system according to claim 6, wherein the second coil is positioned between a warm bore and a gradient coil.

8. The system according to claim 1, wherein the second coil is external to the MRI system.

9. The system according to claim 8, wherein the second coil is disposed within a portable housing.

10. A system for energizing a main coil of a superconducting magnet of a magnetic resonance imaging (MRI) system, the superconducting magnet located in a cryostat having a housing, the system comprising:

a first coil positioned external to the housing of the cryostat;

a second coil coupled to the first coil through a first switch and positioned external to the housing of the cryostat, the second coil configured to inductively couple to the main coil;

a power supply positioned external to the housing of the cryostat and coupled to the first coil and the second coil through a second switch; and a controller coupled to the power supply, the first coil and the second coil, and configured to control the first coil and the second coil to induce current in the main coil.

11. The system according to claim 10, wherein the first coil is a resistive coil.

12. The system according to claim 10, wherein the first coil is positioned within a resonance assembly of the MRI system.

13. The system according to claim 10, wherein the first coil is a gradient coil.

14. The system according to claim 10, wherein the first coil is external to the MRI system.

15. The system according to claim 14, wherein the first coil is disposed within a portable housing.

16. The system according to claim 10, wherein the second coil is a resistive coil.

17. The system according to claim 16, wherein the second coil comprises multiple turns of copper wire.

18. The system according to claim 10, the second coil is positioned within a resonance assembly of the MRI system.

19. The system according to claim 10, wherein the second coil is external to the MRI system.

20. The system according to claim 19, wherein the second coil is disposed within a portable housing.

* * * * *